United States Patent
Arslan et al.

(10) Patent No.: US 9,418,761 B2
(45) Date of Patent: Aug. 16, 2016

(54) APPARATUS FOR BOOSTING SOURCE-LINE VOLTAGE TO REDUCE LEAKAGE IN RESISTIVE MEMORIES

(71) Applicant: Intel Corporation, Santa Clara, CA (US)

(72) Inventors: Umut Arslan, Hillsboro, OR (US); Cyrille Dray, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/569,573

(22) Filed: Dec. 12, 2014

(65) Prior Publication Data

US 2016/0172059 A1 Jun. 16, 2016

(51) Int. Cl.
| | |
|---|---|
| *G11C 11/00* | (2006.01) |
| *G11C 29/50* | (2006.01) |
| *G11C 13/00* | (2006.01) |
| *G11C 29/08* | (2006.01) |

(52) U.S. Cl.
CPC .............. *G11C 29/50* (2013.01); *G11C 13/004* (2013.01); *G11C 29/08* (2013.01); *G11C 2029/5006* (2013.01)

(58) Field of Classification Search
CPC .............. G11C 11/419; G11C 13/0002; G11C 13/003; G11C 13/0038; G11C 8/08
USPC ........................... 365/148, 163, 158, 171, 207
See application file for complete search history.

(56) References Cited

U.S. PATENT DOCUMENTS

| | | | |
|---|---|---|---|
| 6,252,806 B1 | 6/2001 | Ellis et al. | |
| 8,559,209 B2* | 10/2013 | Siau | G11C 8/08 365/130 |
| 2003/0058594 A1* | 3/2003 | Kerger | H02H 7/263 361/80 |
| 2008/0298124 A1 | 12/2008 | Wong | |
| 2011/0075475 A1 | 3/2011 | Lee | |
| 2012/0314477 A1* | 12/2012 | Siau | G11C 8/08 365/148 |
| 2013/0003448 A1 | 1/2013 | Chen et al. | |
| 2013/0141980 A1 | 6/2013 | Kale | |

OTHER PUBLICATIONS

International Search Report & Written Opinion for PCT Patent Application No. PCT/US15/59533 mailed Feb. 17, 2016, 11 pages.

* cited by examiner

*Primary Examiner* — Gene Auduong

(74) *Attorney, Agent, or Firm* — Green, Howard & Mughal LLP

(57) ABSTRACT

Described is an apparatus comprising a leakage tracker to track leakage of a column of resistive memory cells; and a circuit for adjusting voltage on a SourceLine (SL) of the column of resistive memory cells. Described is also an apparatus comprising: a memory array having rows and columns of resistive memory cells; a leakage tracker to track leakage current of a column of resistive memory cells associated with the memory array; and a circuit, coupled to the leakage tracker, for adaptively boosting voltage on a SL of the column of resistive memory cells during read operation.

21 Claims, 9 Drawing Sheets

APPARATUS FOR BOOSTING SOURCE-LINE VOLTAGE TO REDUCE LEAKAGE IN RESISTIVE MEMORIES

BACKGROUND

Resistive memories are non-volatile random access memories (NVRAMs) in which data is stored by resistive storage elements. A resistive memory element can be put in two states (e.g., high and low resistance) to store a bit data. One type of resistive memory cell is a 1T1R (1 transistor, 1 resistor) memory cell. The 1T1R memory cell is composed of a resistive memory element that is connected in series with an access transistor, and the memory cell provides three terminals: Wordline (WL), Bitline (BL) and Sourceline (SL). The 1T1R memory cells are then stacked in columns, each column sharing the BL and SL terminals. The 1T1R memory cell is accessed during read/write operations by asserting the WL that turns on the access transistor. Reading from the memory cell is accomplished by sensing the resistance of the resistive memory element that is positioned between the BL and SL nodes.

In the most common read technique, a fixed voltage is applied between the BL and SL nodes, and the current passing through the resistive memory element is measured by a sense amplifier. However, the leakage current through the unselected memory cells that are located in the same column with the selected memory cell overlap with the data signal, degrading the sense margin. The problem associated with the degraded sense margin is further exacerbated by a higher access transistor leakage in deeply-scaled technologies.

One potential method to reduce sub-threshold leakage is to under-drive the WLs to negative voltage levels. Such a method is typically used in Dynamic Random Access Memories (DRAMs). The negative voltage level for the WLs can be generated using an on-chip charge pump. However, the leakage on the negative supply rail through the WL drivers requires the charge pump to be active even when there is no memory access. This in turn can prohibitively increase the DC (Direct Current) power, particularly for low-power applications. Moreover, the negative supply rail increases the design complexity due to high-voltage induced reliability issues.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
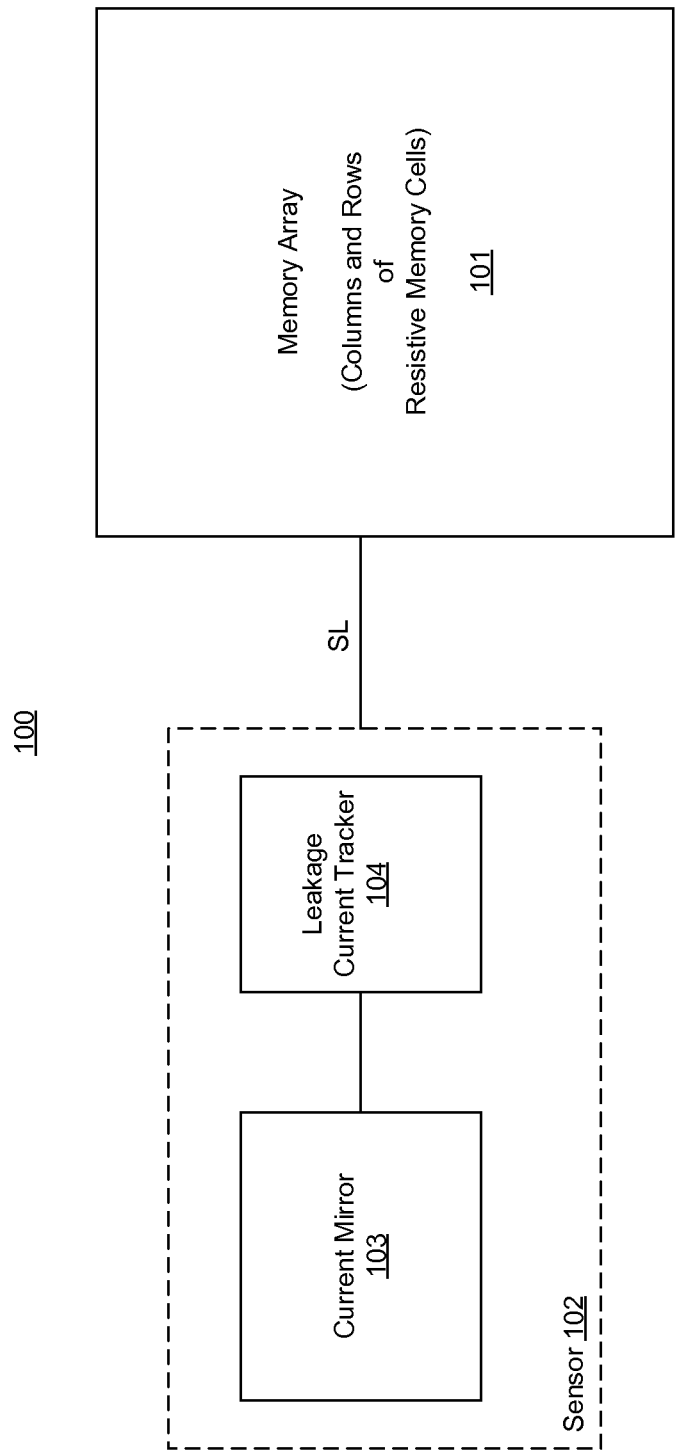
FIG. 1 illustrates a high level block diagram for a leakage sensor for boosting Source-Line (SL) voltage for a column of resistive memory cells, according to some embodiments of the disclosure.

Various embodiments described here reduce memory column leakage that avoids the DC (Direct Current) power and the design complexities associated with a negative supply rail. In some embodiments, an apparatus is provided for boosting the SourceLine (SL) voltage above the ground level (Vss). In some embodiments, the boosted SL results in negative gate-to-source voltage (Vgs) across the access transistor (e.g., n-type transistor) and thus effectively reduces the sub-threshold leakage. In some embodiments, the boosted SL results in positive Vgs across the access transistor when the access transistor is a p-type transistor.

In some embodiments, the amount of the voltage boost that is required to reduce the leakage to a specified target level is determined by a leakage sensor. In some embodiments, the leakage sensor utilizes replica memory columns to track the access transistor leakage that is highly dependent on process, voltage, and temperature (PVT) conditions. In some embodiments, the leakage sensor uses a device that mimics leakage through data columns to track the access transistor leakage. Various embodiments are described that utilize the leakage sensor to control the SL voltage of the data columns.

In memory arrays, the access transistor is usually a device that is optimized to meet the memory performance goals, and therefore its leakage may not fully correlate with that of the logic transistor over process, temperature, and voltage (PVT) variations. By incorporating a replica memory column in the leakage sensor, the leakage sensor can precisely track the access transistor leakage, according to some embodiments. In some embodiments, the replica column is combined with a negative feedback structure in such a way such that the leakage sensor can efficiently determine the SL boost level.

There are many technical effects of various embodiments. For example, in some embodiments, the leakage sensor is only enabled during read operations and thus prevents DC power overhead induced by the charge pump solution. In the charge pump solution, the charge pump should be ON (or partially ON) even when there is no read/write access in order to supply the leakage current of the WL drivers. Therefore, the charge pump solution costs DC power. The dynamic power consumption during read operation is expected to be a small fraction of the total read power, and is lower (e.g., 20% to 40%) than the power consumption of a charge pump.

The total area cost of the SL boost circuitry (also referred to here as the leakage sensor) is also smaller than that of the charge pump. In some embodiments, the leakage sensor exploits the dummy columns that usually exist in the memory arrays for various reasons (e.g. for transition between the array and periphery, to provide space for WL strapping, etc.). In some embodiments, the dummy columns can be used as replica columns inside the leakage sensor, and the rest of the leakage sensor can fit under the dummy columns. In some embodiments, the leakage sensor tracks the process/temperature and automatically or adaptively determines the amount of the SL boost without the need for post-silicon trimming. Other technical effects of various embodiments will be apparent to a person skilled in the art.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, optical, or wireless connection between the things that are connected, without any intermediary devices. The term "coupled" means either a direct electrical, optical, or wireless connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a high level block diagram 100 for boosting SL voltage for a column of resistive memory cells, according to some embodiments of the disclosure. In some embodiments, block diagram 100 comprises Memory Array 101 coupled to Leakage Sensor 102 (or the SL boost circuit), where Leakage Sensor 102 adaptively generates a voltage level for the SL so as to boost its level during read operation. In some embodiments, Memory Array 101 comprises rows and columns of resistive memory cells. Examples of resistive memory cells include; a magnetic tunneling junction (MTJ) device; a phase change memory cell (PCM); a resistive random access memory (ReRAM), etc.

In some embodiments, Leakage Sensor 102 comprises Current Mirror 103 and Leakage Current Tracker 104. In some embodiments, Leakage Current Tracker 104 is a replica column of resistive memory cells which are configured in the off state (e.g., the n-type access transistor gate terminals are coupled to ground). In some embodiments, a maximum column leakage, that a read sense amplifier for the memory architecture can tolerate, is sourced into the Leakage Current Tracker 104 by Current Mirror 103. In some embodiments, Leakage Sensor 102 is disabled during non-read operations on Memory Array 101, and is enabled during read operations. As such, power consumption is saved. In some embodiments, output of Leakage Sensor 102 is the SL which is directly provided to data columns in Memory Array 101. In some embodiments, output SL of Leakage Sensor 102 is buffered by a unity gain buffer and then provided to the SL nodes of data columns of Memory Array 101. Here, labels for nodes and signals are interchangeably used. For example, SL is used to indicate node SL or voltage SL depending on the context of the sentence.

Figure 2:
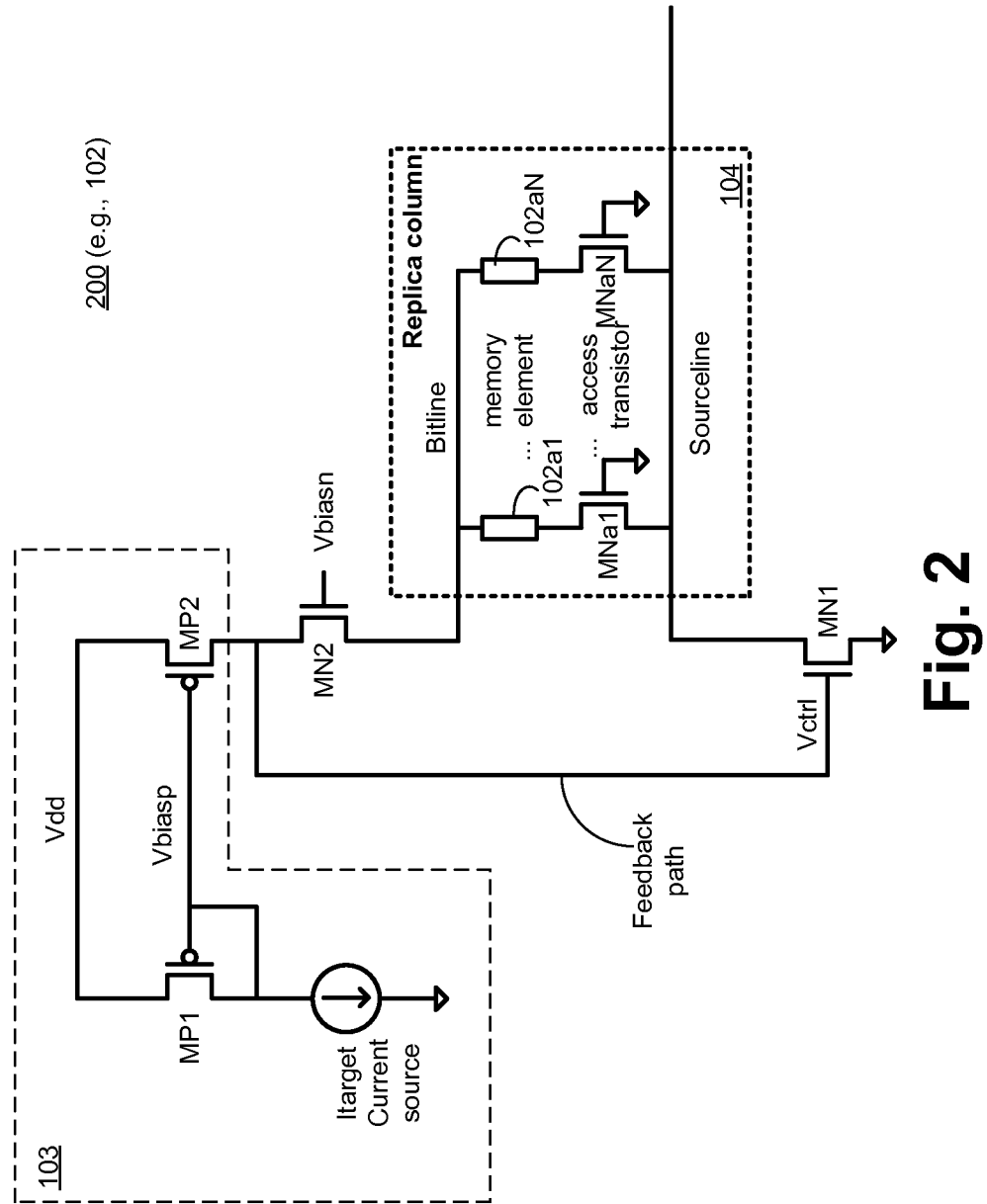
FIG. 2 illustrates a transistor level architecture of a leakage sensor, with a replica column of memory cells, which is operable to boost SL voltage for a column of resistive memory cells, according to some embodiments of the disclosure.

FIG. 2 illustrates a transistor level architecture 200 of Sensor 102, with a replica column of memory cells, which is operable to boost SL voltage for a column of resistive memory cells, according to some embodiments of the disclosure. It is pointed out that those elements of FIG. 2 having the same reference numbers (or names) as the elements of any other figure can operate or function in any manner similar to that described, but are not limited to such.

In some embodiments, architecture 200 comprises Current Mirror 103 which includes a current source and p-type transistors MP1 and MP2; Replica column 102 (e.g., of Leakage Tracker); n-type transistors MN1 and MN2 coupled together as shown. In some embodiments, the maximum column leakage current Itarget, that the read sense amplifier can tolerate, is provided by the current source. Current from the current source is mirrored by transistors MP1 and MP2 and sourced into the replica memory column. In some embodiments, this sourced current is a multiple of or a fraction of Itarget. In some embodiments, Itarget flows through a cascode transistor MN2, replica column 102, and a footer transistor MN1 to the ground node.

In some embodiments, Replica column 102 comprises a column of resistive memory cells that are identical to resistive memory cells of a data column in Memory Array 101. In some embodiments, a column of resistive memory cells includes a plurality of resistive devices 102a1-N (where, 'N' is an integer) coupled in series to respective access transistors MNa1-N, such that the source terminal of the access transistor is coupled to the SL and one terminal of the resistive devices is coupled to the BL. In some embodiments, the gate terminals of the access transistors is coupled to ground to mimic leakage behavior of the replica column.

In some embodiments, the footer transistor MN1 acts as a resistor whose resistance is controlled by the negative feedback loop that couples the drain nodes of transistors MP2 and MN2 to the gate terminal of transistor MN1 (i.e., Vctrl). In some embodiments, the SL voltage is boosted to a certain level by transistor MN1 such that the leakage flowing through Replica column 102 is equalized to Itarget (e.g., when current mirror ratio is 1:1), which is sourced by transistor MP2. In some embodiments, different current mirror ratios can be used. For example, if the current ratio is 1:N, then leakage through replica column 104 is N*Itarget, according to some embodiments.

In some embodiments, under PVT conditions where the non-boosted column leakage is high, Vctrl is discharged by the negative feedback loop to a low voltage making transistor MN1 more resistive and thus raising the voltage on the SL to a higher potential. Under PVT conditions where the non-boosted column leakage is low, Vctrl remains at a high potential and the SL boost is minimal. In such embodiments, the SL voltage tracks PVT without the need for post-silicon trimming.

In some embodiments, transistor MN2 acts as a cascode device that speeds up the discharging of Vctrl after sensor 200 is activated. In some embodiments, transistor MN2 also limits the BL voltage on Replica column 102 so that Replica column 102 operates under similar voltage conditions as the actual data column. In some embodiments, the bias voltage Vbiasn for transistor MN2 is provided externally off-chip. In some embodiments, the bias voltage Vbiasn for transistor MN2 is provided on-chip.

Figure 3:
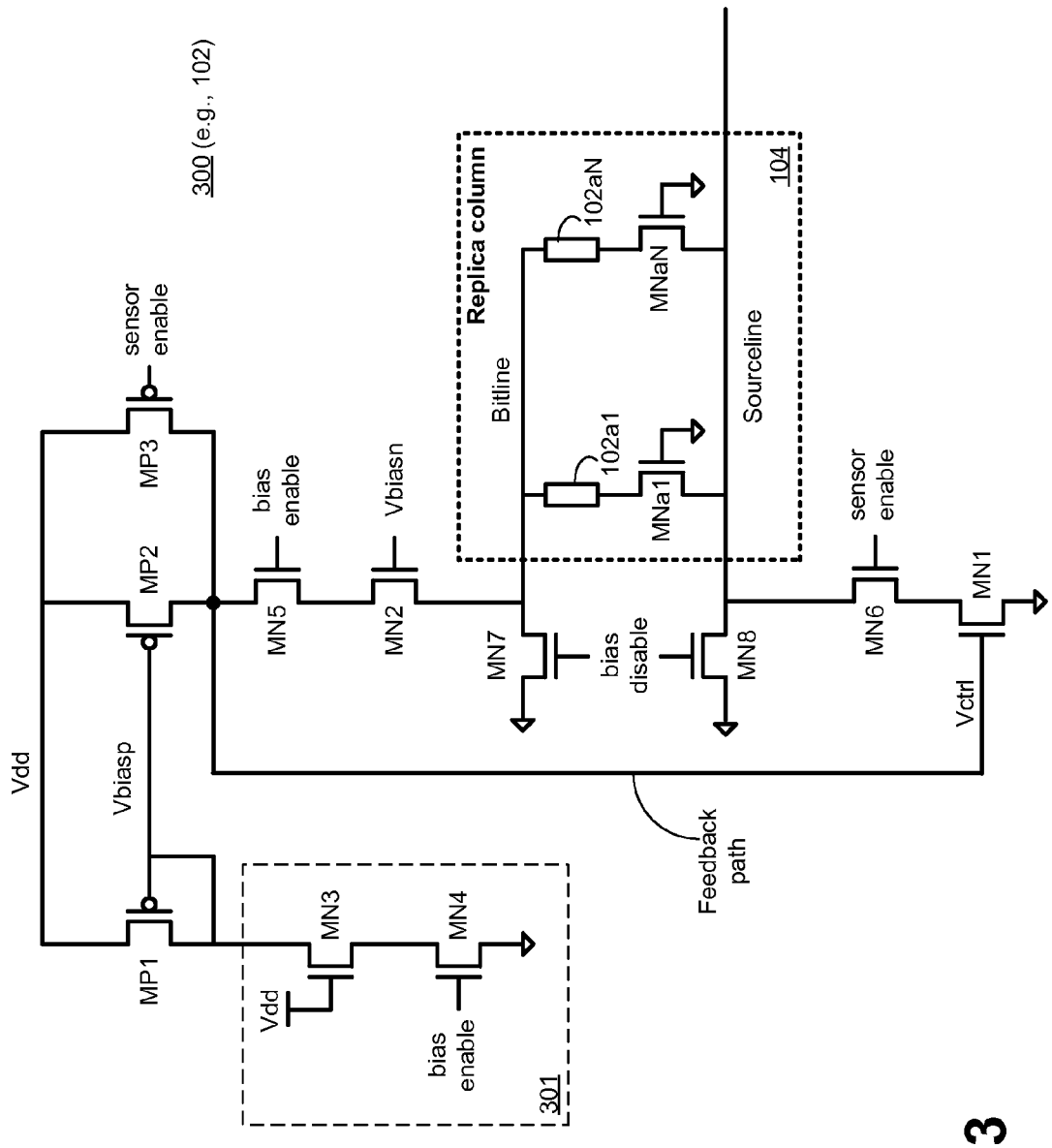
FIG. 3 illustrates a transistor level architecture of a leakage sensor, with a replica column of memory cells, which is operable to boost SL voltage for a column of resistive memory cells, according to some embodiments of the disclosure.

FIG. 3 illustrates transistor level architecture 300 of Sensor 102, with a replica column of memory cells, which is operable to boost SL voltage for a column of resistive memory cells, according to some embodiments of the disclosure. It is pointed out that those elements of FIG. 3 having the same reference numbers (or names) as the elements of any other figure can operate or function in any manner similar to that described, but are not limited to such. FIG. 3 is described with reference to FIG. 2. So, the transistors/devices previously discussed are not described in detail here.

In some embodiments, Sensor 300 (e.g., 102) comprises current source 301 (or current reference) having n-type transistor MN3 and MN4; current mirror transistors MP1 and MP2, footer transistor MN1, cascode transistor MN2, Replica column 102, SL and BL enable/disable transistors MN7 and MN8, sensor enable transistors MP3 and MN6; and bias enable transistors MN4 and MN5.

So as not to obscure the various embodiments, the current reference is realized using an n-type transistor MN3 that operates in the linear region. In this example, the gate terminal of transistor MN3 is coupled to Vdd (power supply). In other embodiments, the gate terminal of transistor MN3 may be coupled to a bias voltage. In some embodiments, current reference 301 may provide a reference current variation of 2× over PVT skews, which may be acceptable for the column leakage sensor application, according to some embodiments.

In some embodiments, during the absence of read access to Memory Array 101, Leakage Sensor 300/102 is turned off to prevent DC power consumption. In some embodiments, transistors MN4, MN5, and MN6 are turned off to cut off the DC current flows during non-read access to Memory Array 101. For example, when a write operation is performed on Memory Array 101, transistors MN4, MN5, and MN6 are turned off to cut off the DC current flow. In some embodiments, transistor MP3 is turned on to pre-charge Vctrl to Vdd. One reason for pre-charging Vctrl to Vdd is to tune transistor MN1 to a low resistance state and thus prevent voltage overshoot on the SL due to incoming current from the data columns just after Sensor 300 is enabled.

In some embodiments, transistors MN7 and MN8 pre-discharge the replica BL and SL nodes to Vss (i.e., ground) to prevent potential history effects from materializing between subsequent read operations. In some embodiments, control signals such as bias enable and sensor enable signals, are used to wake up Leakage Sensor 300/102. In some embodiments, these control signals can be asserted at the same time. In some embodiments, bias enable can be asserted before the sensor enable (e.g., one to two clock phases earlier in time) depending on the sensor configuration.

In some embodiments, the bias enable signal enables the reference current path by turning on transistor MN4. In some embodiments, the bias enable signal also turns on transistor MN5 to pre-charge the replica BL to approximately Vbiasn-Vtn. In some embodiments, this pre-charging process prevents Vctrl from undershooting due to charge sharing when Sensor 300 is enabled. In some embodiments, sensor enable turns off transistor MP3 to enable the current mirror (i.e., transistors MP1 and MP2) and turns on the transistor MN6 to enable the current flow through Replica memory column 102.

Figure 4:
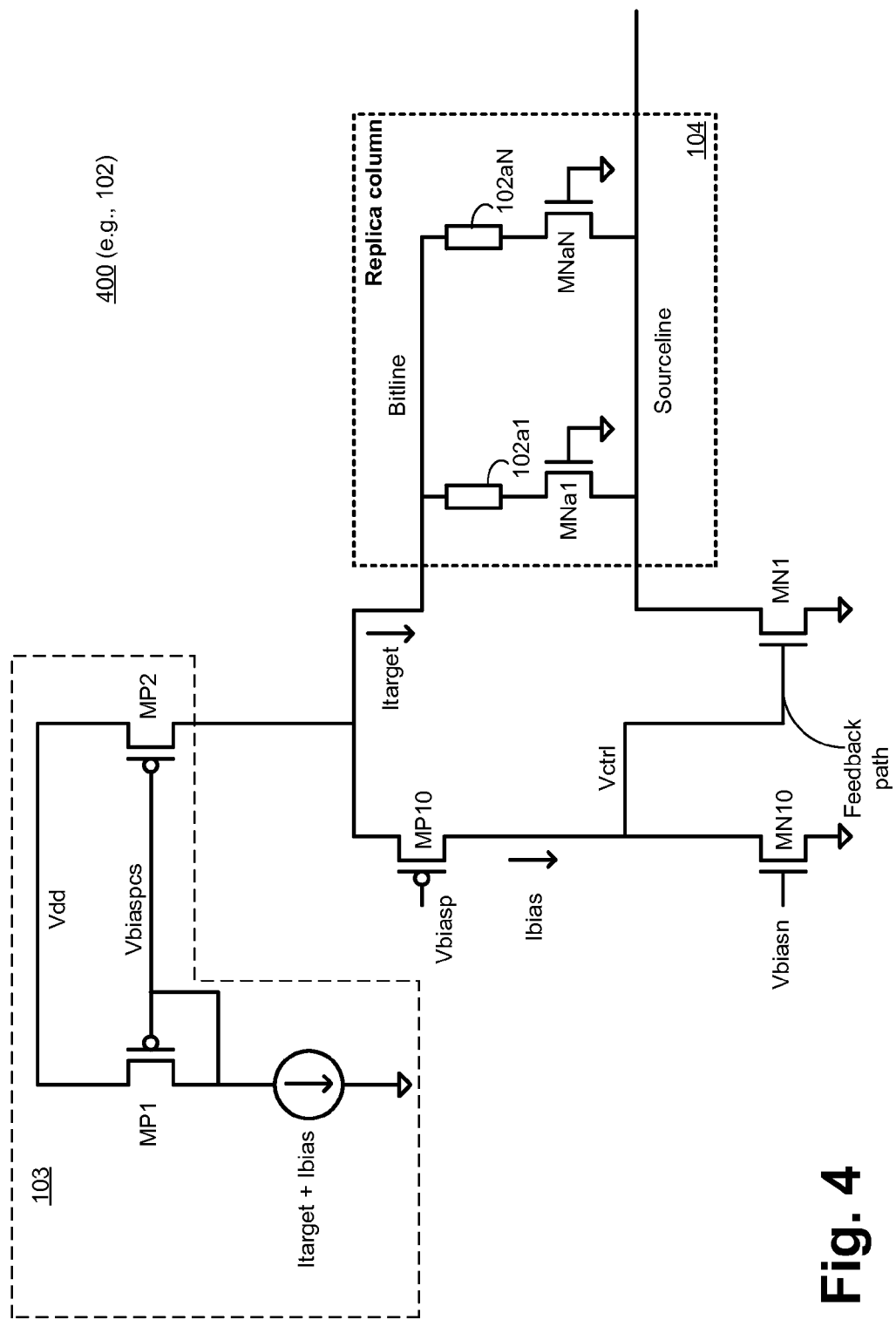
FIG. 4 illustrates a transistor level folded architecture of a leakage sensor, with a replica column of memory cells, which is operable to boost SL voltage for a column of resistive memory cells, according to some embodiments of the disclosure.

FIG. 4 illustrates transistor level folded architecture 400 of Sensor 102, with a replica column of memory cells, which is operable to boost SL voltage for a column of resistive memory cells, according to some embodiments of the disclosure. It is pointed out that those elements of FIG. 4 having the same reference numbers (or names) as the elements of any other figure can operate or function in any manner similar to that described, but are not limited to such.

FIG. 4 is described with reference to FIG. 2. In some embodiments, the current path from current mirror transistor MP2 is input to a folded circuit or a differential-like circuit having transistors MP10, MN10, and MN1 coupled together as shown. Operation wise, Sensor 400 operates the same way as Sensor 200. In some embodiments, MP10 is biased by Vbiasp and MN10 is biased by Vbiasn.

The embodiment described in FIG. 2 includes four stacked devices (i.e., transistors MP2/MN2/MNa1-N/MN1) and thus may use large voltage headroom which may not always be available in advanced technology generations. To relax the voltage headroom requirement of the topology 200, folded topology 400 can be used. In some embodiments, folded topology 400 includes three stacked devices. In some embodiments, the three stacked devices form the limit of maximum number of stacked devices used in folded topology 400.

One technical effect of folded topology 400 is that it can provide more robust transistor biasing (e.g., compared to sensor 200) and allow wider voltage swing for Vctrl (e.g., compared to sensor 200). In some embodiments, current mirror structure formed by transistors MP1 and MP2 supplies a bias current (Ibias) for the folded branch formed by transistors MP10 and MN10 in addition to Itarget that is sourced into the replica column.

Figure 5:
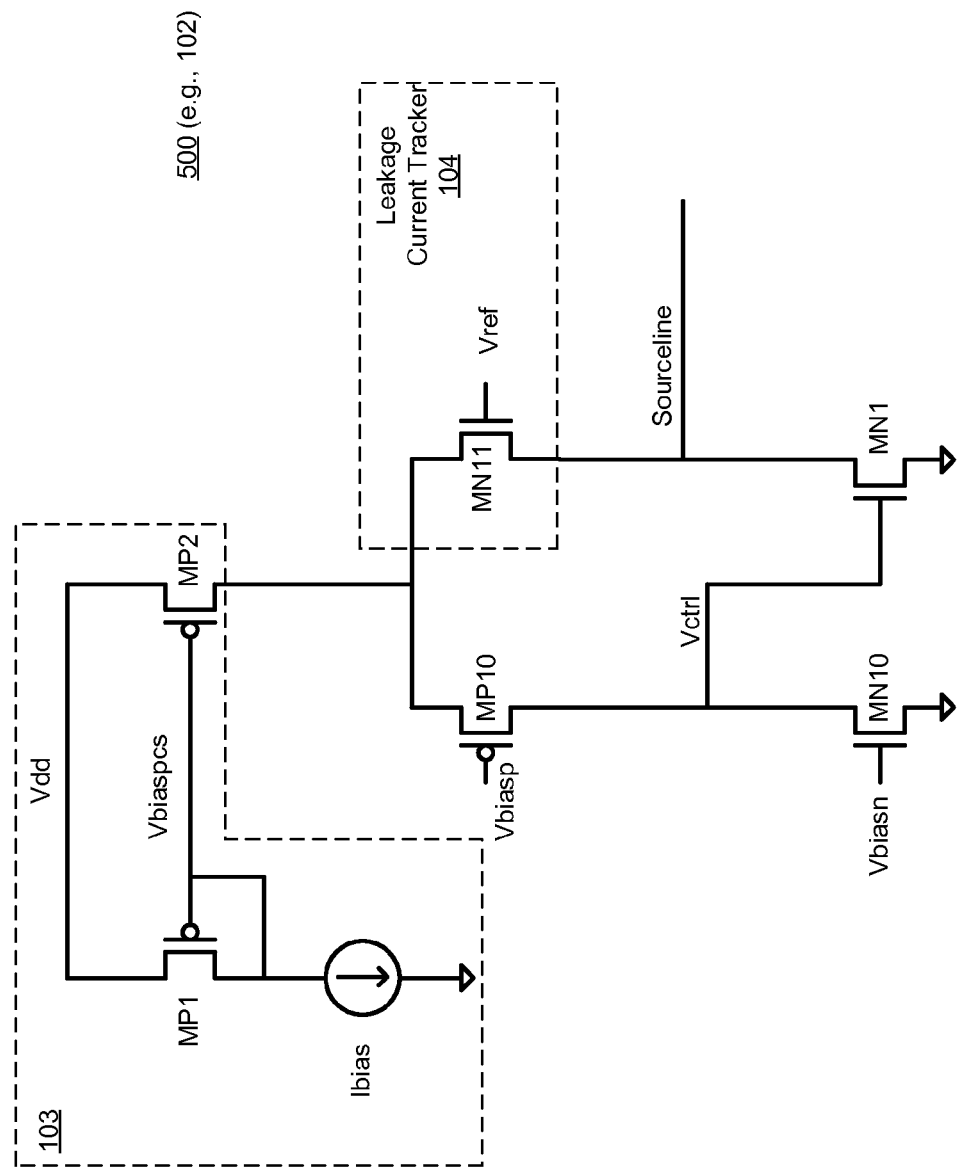
FIG. 5 illustrates a transistor level architecture of a leakage sensor, with a device mimicking leakage through a data column, which is operable to boost SL voltage for a column of resistive memory cells, according to some embodiments of the disclosure.

FIG. 5 illustrates transistor level architecture 500 of Sensor 102, with device mimicking leakage through a data column, which is operable to boost SL voltage for a column of resistive memory cells, according to some embodiments of the disclosure. It is pointed out that those elements of FIG. 5 having the same reference numbers (or names) as the elements of any other figure can operate or function in any manner similar to that described, but are not limited to such.

FIG. 5 is described with reference to FIG. 2 and FIG. 4. In some embodiments, sensor 500 comprises current mirror (having transistors MP1 and MP2), current source Ibias, and folded differential-like circuit providing boosted SL to Memory Array 101. In some embodiments, the folded differential-like circuit includes a first branch (i.e., the right side branch) having Leakage Current Tracker Device 104 coupled in series to footer transistor MN1, and a second branch (i.e., the left side branch) having two biased transistors MP10 and MN10 coupled in series. In some embodiments, the drain terminals of transistors MN10 and MP10 provide Vctrl to bias transistor MN1.

In some embodiments, Leakage Current Tracker Device 104 is an n-type device MN11 which mimics the leakage behavior of a column of data resistive memory cells in Memory Array 101. For example, for a given bias current and Vref, the SL voltage tracks the threshold voltage of the n-type devices. When the n-device threshold voltage is low and memory column leakage is high, SL voltage is boosted high which reduces column leakage for the unselected columns in Memory Array 101. When the n-device threshold voltage is high and column leakage is low, the SL voltage stays low. By changing Vref, the SL boost level can be tuned (i.e., adjusted), according to some embodiments.

In some embodiments, transistor MN11 has a size (W/L) which is substantially equal to the size of access transistors in a data column of resistive memory cells in Memory Array 101. As such, transistor MN11 models the current leakage through an unselected data column. In some embodiments, transistor M11 behavior (i.e., I/V characteristics or leakage characteristics) correlates with the access devices from the perspective of process variation. For example, when the same type of device is used for both transistor MN11 and the access device then transistor M11 leakage behavior correlates with the access device of Memory Array 101.

Compared to the leakage current tracker of some embodiments, transistor MN11 is an always-on device instead of always-off devices MNa1-N of Replica column 102. In some embodiments, Leakage Current Tracker Device 104 includes different types of transistors compared to other transistors in sensor 500. For example, transistor M11 may be a BJT (e.g., NPN BJT) device, diode, MOS, device so long as the transistor M11 mimics the leakage behavior of a column of data resistive memory cells in Memory Array 101.

Figure 6:
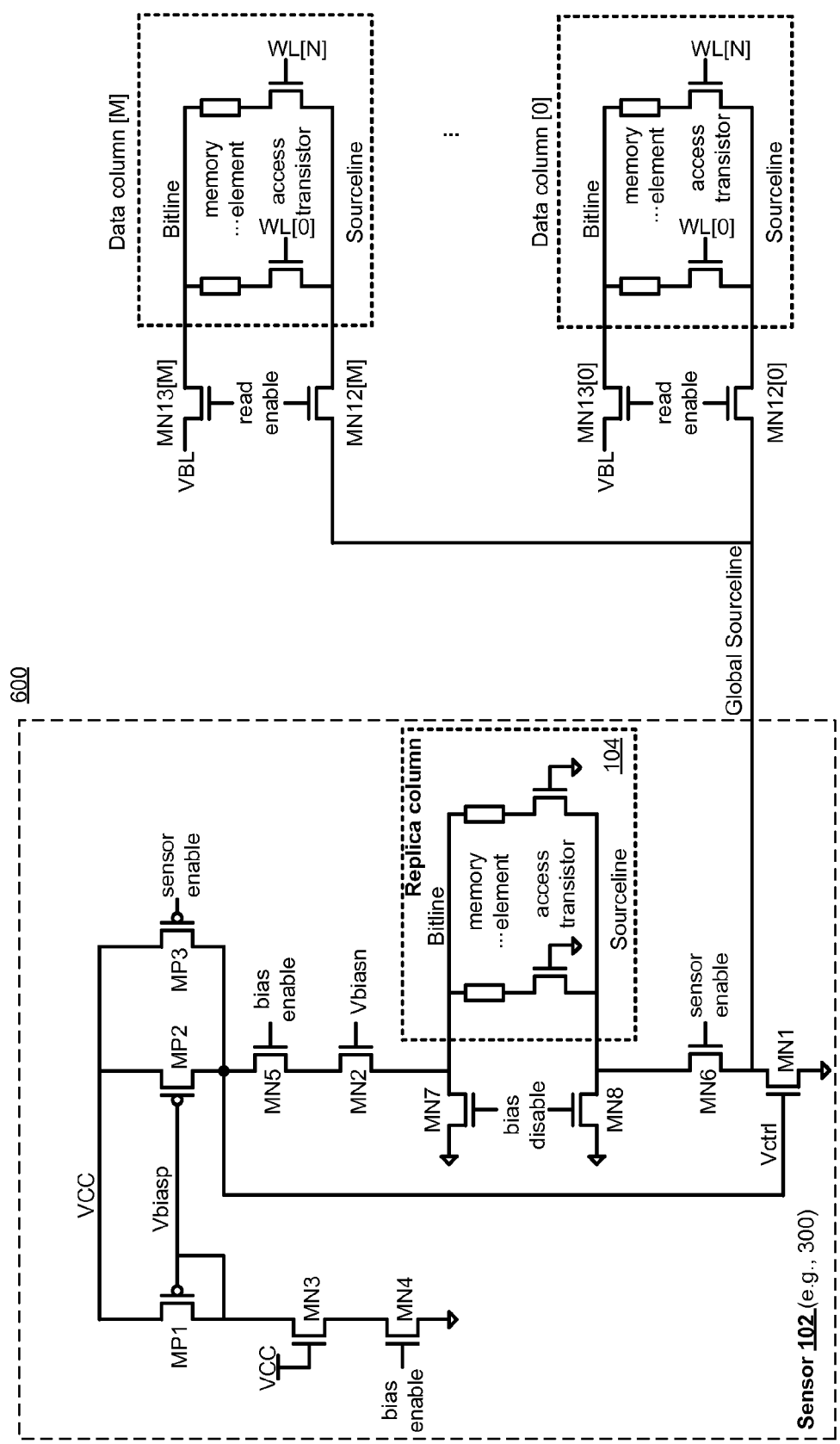
FIG. 6 illustrates an architecture using a global SL directly from a leakage sensor to boost SL voltage for a data column of memory cells, according to some embodiments of the disclosure.

FIG. 6 illustrates architecture 600 using a global SL directly from a leakage sensor to boost the SL voltage for a data column of memory cells, according to some embodiments of the disclosure. It is pointed out that those elements of FIG. 6 having the same reference numbers (or names) as the elements of any other figure can operate or function in any manner similar to that described, but are not limited to such.

While the sensor described in FIG. 6 is Sensor 300 of FIG. 3, any sensor described with reference to various embodiments may be used here to provide the boosted SL (labeled here as Global Sourceline). For example, Sensor 300 of FIG. 6 can be replaced with one of sensors 200, 400, or 500, etc. In some embodiments, Memory Array 101 comprises 'M' data columns—Data Column[0] to Column[M], where 'M' is an integer. Each data column comprises a plurality of resistive memory cells with access transistors. Each access transistor is controllable by a WL signal (e.g., WL[0] to WL[M]) as shown.

In some embodiments, the SL nodes of each data column are shorted between the data and replica columns (named as "Global Sourceline"). The number of data columns served by a single leakage sensor depends on the implementation specifics such as layout limitations, interconnect resistance, etc. The SL boost is generated by both on and off column currents flowing through the footer transistor MN1, according to some embodiments. In some embodiments, "sensor enable" signal is timed synchronously with "read enable" signal (e.g., their transition edges are aligned) to achieve proper settling behavior of the Global Sourceline and internal nodes of the sensor.

In some embodiments, the SL and BL of each data column are coupled to enabling transistors MN12 and MN13. For example, the BL of data column[M] is coupled to source/drain terminal of transistor MN13[M], where the drain/source terminal of MN13[M] is coupled to a predetermined voltage level (here, bit-line voltage VBL). The SL of data column[M] is coupled to the source/drain terminal of transistor MN13[M], where the drain/source terminal of MN12[M] is coupled to the Global Sourceline from the sensor. Likewise, BL of data column[0] is coupled to source/drain terminal of transistor MN13[0], where the drain/source terminal of MN13[0] is coupled to a VBL. The SL of data column[0] is coupled to the source/drain terminal of transistor MN13[0], where the drain/source terminal of MN12[0] is coupled the Global Sourceline from the sensor.

In one example, to achieve a target column leakage of 1 µA, the Global Sourceline is boosted to approximately 230 mV for fast process at 110 degrees Celsius. Continuing with the same example, the Global Sourceline may be boosted to approximately 20 mV for slow process at −10 degrees Celsius.

Figure 7:
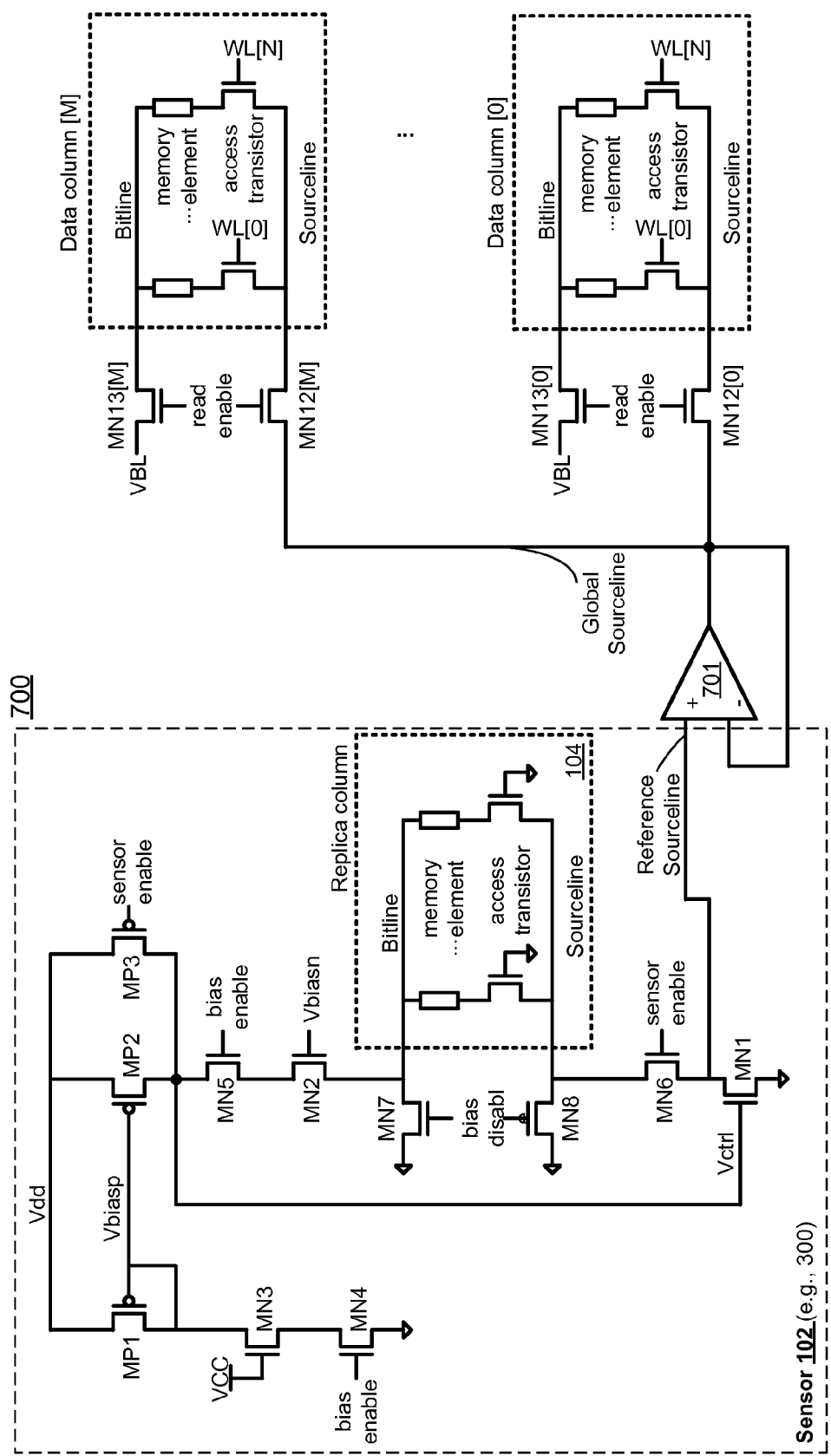
FIG. 7 illustrates an architecture using a unity gain buffer coupled to the leakage sensor to boost SL voltage for a data column of memory cells, according to some embodiments of the disclosure.

FIG. 7 illustrates architecture 700 using a unity gain buffer coupled to the leakage sensor to provide a global SL to boost SL voltage for a data column of memory cells, according to some embodiments of the disclosure. It is pointed out that those elements of FIG. 7 having the same reference numbers (or names) as the elements of any other figure can operate or function in any manner similar to that described, but are not limited to such. While the sensor described in FIG. 6 is sensor 300 of FIG. 3, any sensor described with reference to various embodiments may be used here to provide boosted SL. For example, sensor 300 of FIG. 6 can be replaced with one of sensors 200, 400, 500, etc.

To achieve faster settling behavior, the boost circuitry can be configured differently. In some embodiments, the replica and data columns are separated. In some embodiments, the leakage sensor provides a Reference Sourceline and a separate negative feedback loop is used to equalize the data SL voltage to the reference SL voltage. This second feedback can potentially be designed to respond faster and thus provide faster settling time.

So as not to obscure the various embodiments, FIG. 7 is described with reference to FIG. 6. As such, differences between the two figures are highlighted. In some embodiments, the Global Sourceline is not directly provided from the sensor to Memory Array 101, but instead is buffered. In some embodiments, unity gain buffer 701 is used to buffer the Reference Sourceline from the sensor and is provided as the Global Sourceline.

Figure 8:
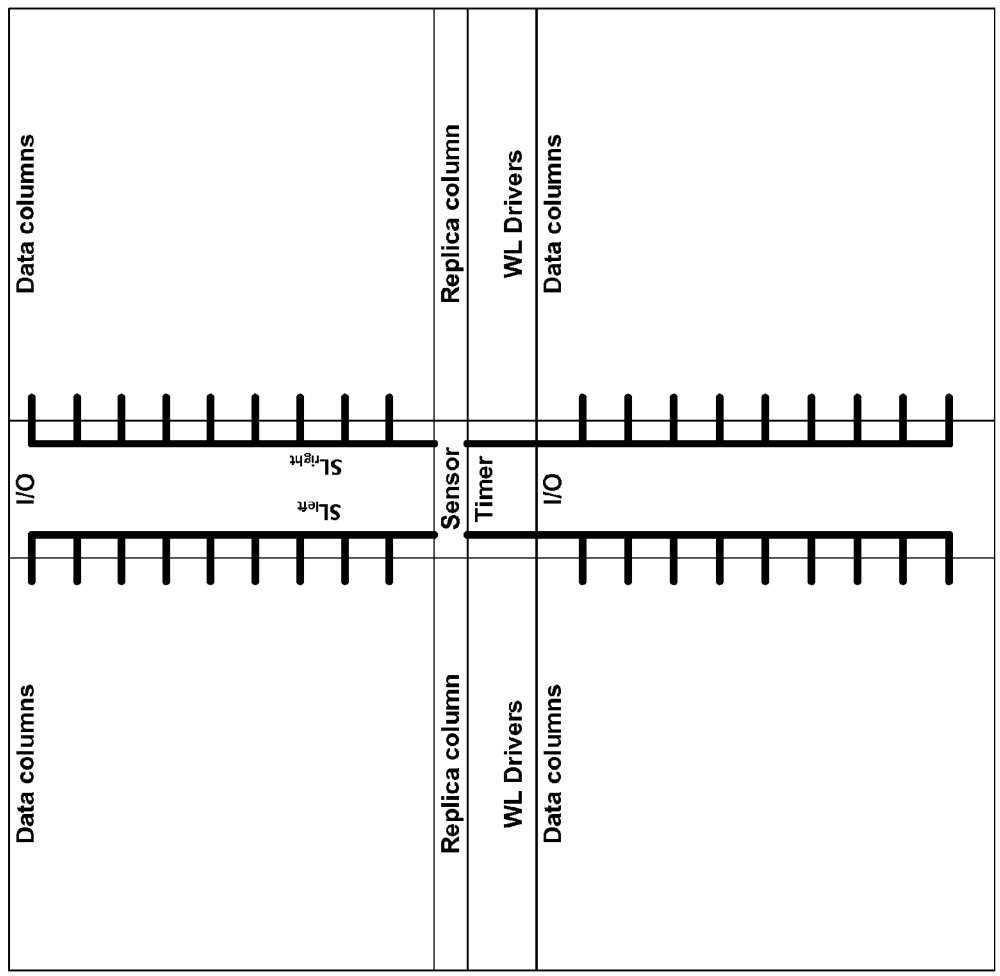
FIG. 8 illustrates a floor plan of memory array have replica columns and leakage sensor(s), according to some embodiments of the disclosure.

FIG. 8 illustrates floor plan 800 of memory array having replica columns and a leakage sensor, according to some embodiments of the disclosure. It is pointed out that those elements of FIG. 8 having the same reference numbers (or names) as the elements of any other figure can operate or function in any manner similar to that described, but are not limited to such.

In some embodiments, the leakage sensor can use the already existing dummy columns in the layout of Memory Array 101 as replica columns as discussed in FIG. 3, and the rest of the sensor can fit in under the dummy columns as shown in floor plan 800. Referring back to FIG. 8, in some embodiments, a single sensor can serve a number of data columns. In some embodiments, multiple sensors are coupled to data columns such that one sensor is associated with a set of data columns. In some embodiments, when there is a read access to the right side of the sub-array (i.e., the right sector), the replica column on the left side can be activated to boost $SL_{right}$. In some embodiments, in the case of read access to the left sector, the right replica column is activated to boost $SL_{left}$.

Figure 9:
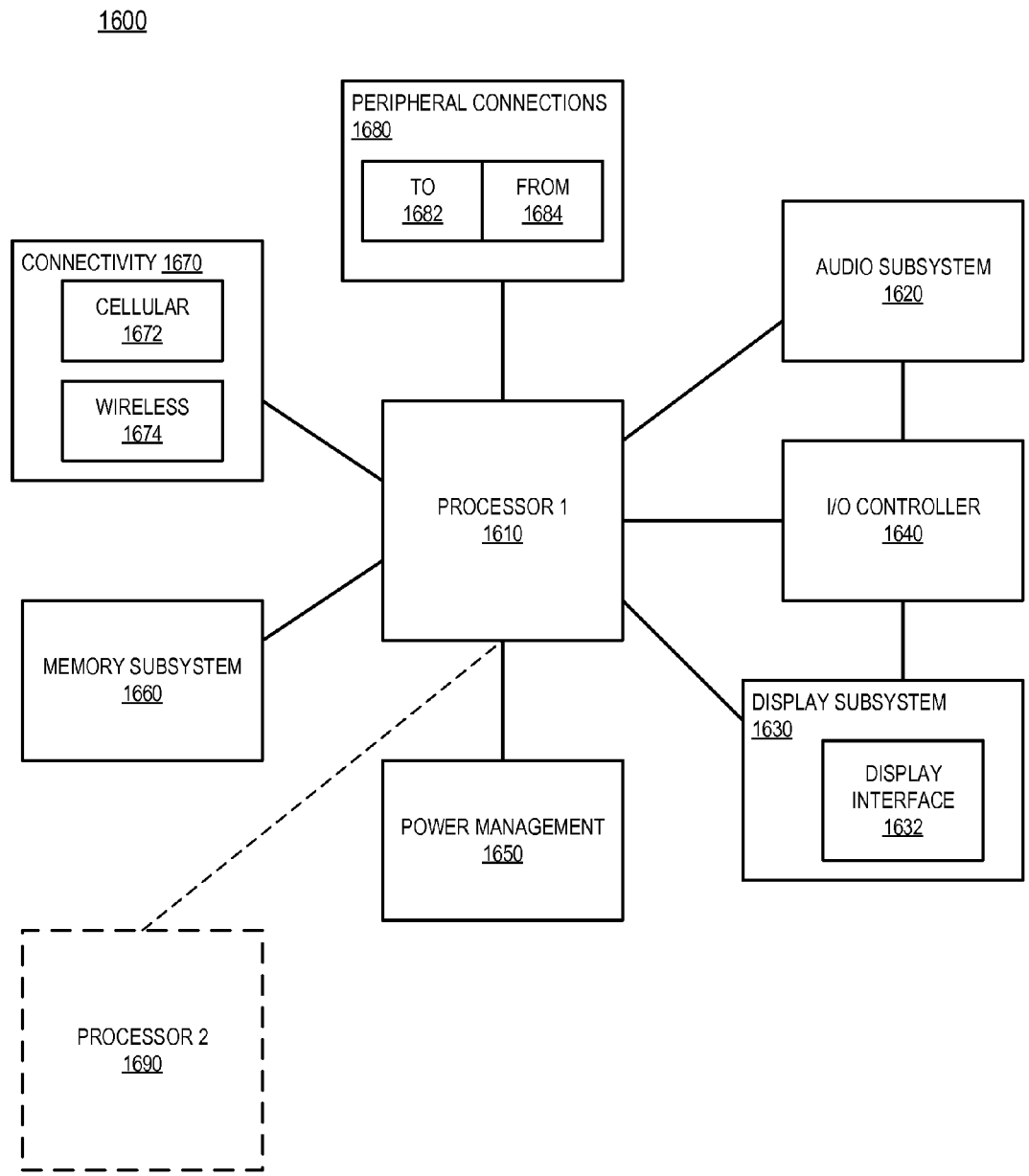
FIG. 9 illustrates a smart device or a computer system or a SoC (System-on-Chip) with a leakage sensor to boost SL voltage for a column of resistive memory cells, according to some embodiments.

FIG. 9 illustrates a smart device or a computer system or a SoC (System-on-Chip) with a leakage sensor to boost SL voltage for a column of resistive memory cells, according to some embodiments. It is pointed out that those elements of FIG. 11 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with a leakage sensor to boost SL voltage for a column of resistive memory cells, according to some embodiments discussed. Other blocks of the computing device 1600 may also include a leakage sensor to boost SL voltage for a column of resistive memory cells of some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises Connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a leakage tracker to track leakage current of a column of resistive memory cells; and a circuit, coupled to the leakage tracker, for adjusting voltage on a SL of the column of resistive memory cells. In some embodiments, the circuit to adaptively adjust the voltage on the SL. In some embodiments, the leakage tracker includes a replica column of resistive memory cells, and wherein the replica column includes a BL and a SL. In some embodiments, the circuit includes a current mirror. In some embodiments, the circuit includes a negative feedback path to control a voltage on a gate terminal of a transistor such that leakage current through the replica column is substantially equal to a ratio of current of the current mirror.

In some embodiments, the SL of the replica column is electrically shorted to a SL of a data column. In some embodiments, at least one of the resistive memory cells includes an access transistor having a gate terminal coupled to ground, and wherein the access transistor includes a source/drain terminal coupled to the SL. In some embodiments, the circuit is operable to turn on during memory read operations. In some embodiments, the circuit is operable to turn off during non-read operations. In some embodiments, the replica column is positioned within data columns of a memory array.

In some embodiments, the resistive memory cells comprise at least one of: a magnetic tunneling junction device; a phase change memory cell; or a resistive random access memory. In some embodiments, the leakage tracker comprises one or more transistors mimicking leakage behavior of a column of resistive memory cells. In some embodiments, the one or more transistors are of same or different type than transistors of the circuit. In some embodiments, the leakage tracker is structurally substantially identical to a data column. In some embodiments, the apparatus comprises: a unity gain amplifier coupled to the circuit, wherein the unity gain amplifier to generate a boosted SL voltage for the column of resistive memory cells.

In another example, a system is provided which comprises: a memory; a processor coupled to the memory, the processor including an apparatus according to the apparatus described above; and a wireless interface for allowing the processor to communicate with another device.

In another example, an apparatus comprises: a memory array having rows and columns of resistive memory cells; a leakage tracker to track leakage current of a column of resistive memory cells associated with the memory array; and a circuit, coupled to the leakage tracker, for adaptively boosting voltage on a SL of the column of resistive memory cells during read operation. In some embodiments, the leakage tracker includes a replica column of resistive memory cells, the replica column having a BL and a SL. In some embodiments, the circuit includes a current mirror, and wherein the circuit includes a negative feedback path to control a voltage to a gate terminal of a transistor such that leakage current through the replica column is substantially equal to a ratio of current of the current mirror.

In another example, a system is provided which comprises: a memory; a processor coupled to the memory, the processor including an apparatus according to the apparatus described above; and a wireless interface for allowing the processor to communicate with another device.

In another example, a method is provided which comprises: tracking leakage current of a column of resistive memory cells; and adjusting voltage on a SL of the column of resistive memory cells. In some embodiments, the method comprises: adaptively adjusting the voltage on the SL. In some embodiments, the apparatus comprises providing a negative feedback path to control a voltage on a gate terminal of a transistor such that leakage current through a replica column is substantially equal to a ratio of current of a current mirror. In some embodiments, the method comprises electrically shorting the SL of the replica column to a SL of a data column. In some embodiments, the resistive memory cells comprise at least one of: a magnetic tunneling junction device; a phase change memory cell; or a resistive random access memory. In some embodiments, the method comprises mimicking leakage behavior of a column of resistive memory cells. In some embodiments, the method comprises generating a boosted SL voltage for the column of resistive memory cells.

In another example, an apparatus is provided which comprises: means for tracking leakage current of a column of resistive memory cells; and means for adjusting voltage on a SL of the column of resistive memory cells. In some embodiments, the apparatus comprises means for adaptively adjusting the voltage on the SL. In some embodiments, the apparatus comprises means for providing a negative feedback path to control a voltage on a gate terminal of a transistor such that leakage current through a replica column is substantially equal to a ratio of current of a current mirror.

In some embodiments, the apparatus comprises means for electrically shorting the SL of the replica column to a SL of a data column. In some embodiments, the resistive memory cells comprise at least one of: a magnetic tunneling junction device; a phase change memory cell; or a resistive random access memory. In some embodiments, the apparatus comprises means for mimicking leakage behavior of a column of resistive memory cells. In some embodiments, the apparatus comprises means for generating a boosted SL voltage for the column of resistive memory cells.

In another example, a system is provided which comprises: a memory; a processor coupled to the memory, the processor including an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
    a leakage tracker to track leakage current of a column of resistive memory cells; and
    a circuit, coupled to the leakage tracker, for adjusting voltage on a Source Line (SL) of the column of resistive memory cells.
2. The apparatus of claim 1, wherein the circuit is to adaptively adjust the voltage on the SL.
3. The apparatus of claim 1, wherein the leakage tracker includes a replica column of resistive memory cells, and wherein the replica column includes a Bit Line (BL) and a SL.
4. The apparatus of claim 3, wherein the circuit includes a current mirror.
5. The apparatus of claim 4, wherein the circuit includes a negative feedback path to control a voltage on a gate terminal of a transistor such that leakage current through the replica column is substantially equal to a ratio of current of the current mirror.
6. The apparatus of claim 3, wherein the SL of the replica column is electrically shorted to a SL of a data column.
7. The apparatus of claim 3, wherein at least one of the resistive memory cells includes an access transistor having a gate terminal coupled to ground, and wherein the access transistor includes a source/drain terminal coupled to the SL.
8. The apparatus of claim 1, wherein the circuit is operable to turn on during memory read operations.
9. The apparatus of claim 1, wherein the circuit is operable to turn off during non-read operations.
10. The apparatus of claim 1, wherein the replica column is positioned within data columns of a memory array.
11. The apparatus of claim 1, wherein the resistive memory cells comprise at least one of:
    a magnetic tunneling junction device;
    a phase change memory cell; or
    a resistive random access memory.
12. The apparatus of claim 1, wherein the leakage tracker comprises one or more transistors mimicking leakage behavior of a column of resistive memory cells.
13. The apparatus of claim 12, wherein the one or more transistors are of same or different type than transistors of the circuit.

14. The apparatus of claim 1, wherein the leakage tracker is structurally substantially identical to a data column.

15. The apparatus of claim 1 comprises a unity gain amplifier coupled to the circuit, wherein the unity gain amplifier is to generate a boosted SL voltage for the column of resistive memory cells.

16. An apparatus comprising:
- a memory array having rows and columns of resistive memory cells;
- a leakage tracker to track leakage current of a column of resistive memory cells associated with the memory array; and
- a circuit, coupled to the leakage tracker, for adaptively boosting voltage on a Source Line (SL) of the column of resistive memory cells during read operation.

17. The apparatus of claim 16, wherein the leakage tracker includes a replica column of resistive memory cells, wherein the replica column has a Bit Line (BL) and a SL.

18. The apparatus of claim 16, wherein the circuit includes a current mirror, and wherein the circuit includes a negative feedback path to control a voltage to a gate terminal of a transistor such that leakage current through the replica column is substantially equal to a ratio of current of the current mirror.

19. A system comprising:
- a memory;
- a processor coupled to the memory, the processor including an apparatus which comprises:
  - a leakage tracker to track leakage current of a column of resistive memory cells; and
  - a circuit, coupled to the leakage tracker, for adjusting voltage on a Source Line (SL) of the column of resistive memory cells; and
- a wireless interface for allowing the processor to communicate with another device.

20. The system of claim 19, wherein the leakage tracker includes a replica column of resistive memory cells, and wherein the replica column has a Bit Line (BL) and a SL.

21. The system of claim 19, wherein the circuit includes:
- a current mirror; and
- a negative feedback path to control a voltage to a gate terminal of a transistor such that leakage current through the replica column is substantially equal to a ratio of current of the current mirror.

\* \* \* \* \*